(12) United States Patent
Chapple

(10) Patent No.: US 6,519,310 B2
(45) Date of Patent: Feb. 11, 2003

(54) HARDWARE EVENT BASED FLOW CONTROL OF COUNTERS

(75) Inventor: James S. Chapple, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/818,728

(22) Filed: Mar. 28, 2001

(65) Prior Publication Data

US 2002/0172320 A1 Nov. 21, 2002

(51) Int. Cl.⁷ .............................................. G06M 11/00
(52) U.S. Cl. .............................. 377/1; 377/15; 377/16
(58) Field of Search .............................. 377/1, 16, 15

(56) References Cited

U.S. PATENT DOCUMENTS 6,378,018 B1 * 4/2002 Tsern et al. ................. 710/129

* cited by examiner

Primary Examiner—Margaret R. Wambach
(74) Attorney, Agent, or Firm—Antonelli, Terry, Stout & Kraus, LLP

(57) ABSTRACT

An integrated circuit chip includes counters. Each one of the counters counts data events, There are a plurality of registers associated with the counters. At lease one of the registers controls the stopping, starting and counting of an associated counter. A command trigger issues a command to the register upon the detection of a hardware event. The command initiates the starting, stopping or counting of the counter associated with the register.

18 Claims, 3 Drawing Sheets

FIG. 4(a) CLOCK
FIG. 4(b) EVENT A
FIG. 4(c) EVENT B
FIG. 4(d) EVENT C
FIG. 4(e) COUNTER 0

HARDWARE EVENT BASED FLOW CONTROL OF COUNTERS

BACKGROUND

1. Field

This invention relates generally to counters. In particular, the present invention relates to event based control of counters in an integrated circuit chip.

2. Description

An integrated circuit (IC) chip may use performance counters to monitor the performance of the chip in various ways. A performance counter may be used to count the number of data events occurring in a predetermined period of time at some regular or random interval. For example, some conventional processors have counters which count the number of instructions that have been run by the processor and/or the number of cache hits so that a ratio may be calculated of the number of cache bits per instruction.

Event based control of performance counters is typically limited to sampling counter values and is not actually controlled by the occurrence of actual hardware events. Typically, performance counter control is done in a time-based (polling) fashion. For example, U.S. Pat. No. 6,026,139 to Frank Hady et al deals with methods of using a counter in an integrated circuit chip to collect data for system performance tuning in each of a plurality of sample measurement periods. However, there are some sets of data that are only meaningful, or are more meaningful, in relation to the occurrence of other events. For example, it may be desired to know the number of times event A occurred between events B and C. In such cases, the regular or random sampling is insufficient to gather this type of data.

As an example, in graphics controllers it can be valuable to know the number of certain events (i.e., polygons filled) on a per frame basis. But the hardware of conventional graphics controllers does not support event based sampling. Therefore, a software controlled method for facilitating graphics event controlled sampling is used wherein special instructions are injected into the graphics software driver to notify the graphics controller hardware when to take a sample. Because of the need for interaction with the graphics software driver, software based event based sampling is limited to a few graphic events and very limited in its capabilities.

External observation tools, such as logic analyzers, may have the ability to trigger data captures. But they do not have the same capabilities as performance counters and cannot observe internal events.

BRIEF DESCRIPTION Of THE DRAWINGS

The foregoing and a better understanding of the present invention will become apparent from the following detailed description of example embodiments and the claims when read in connection with the accompanying drawings, all forming a part of the disclosure of the invention. While the foregoing and following written and illustrated disclosure focuses on disclosing example embodiments of the invention, it should be clearly understood that the same is by way of illustration and example only and is not to be taken by way of limitation, the spirit aid scope of the present invention being limited only by the terms of the claims in the patent issuing from this application.

DETAILED DESCRIPTION

Figure 1:
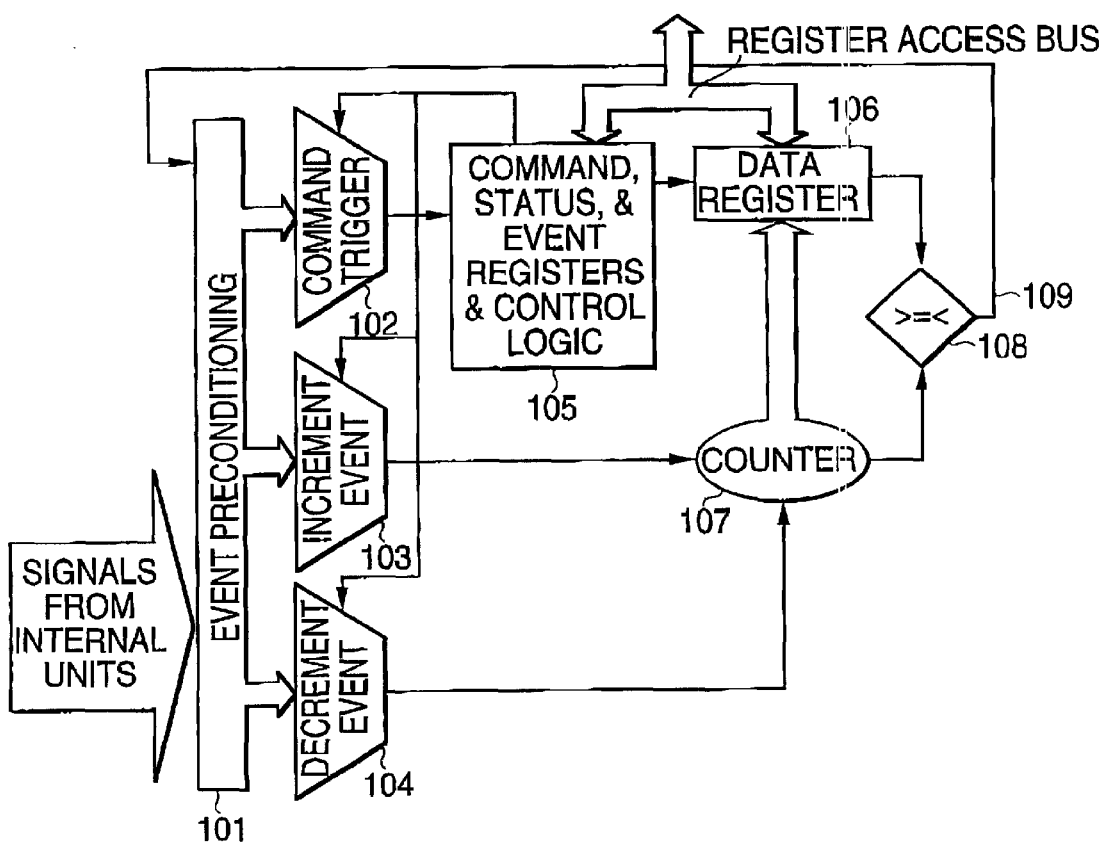
FIG. 1 is a generalized block diagram providing a basic illustration of a counter block according to an example embodiment of the invention.

An embodiment of the present invention seeks to provide hardware based event flow control of performance counters in an integrated circuit chip. An example application of the invention is in a processor or chipset of a desktop computer having performance counters for performance monitoring. In particular, an example embodiment of the invention can be incorporated in the silicon of a microprocessor or a component of a chipset, such as a Memory Controller Hub (MCH).

The example embodiment of the invention may of course be applied in any chip or chipset (with or without integrated graphics) and indeed wherever hardware event based sampling is desired for whatever reason. As an example, the number of cache hits that occur between the time a cache flush occurs and the first cache miss occurs could be counted. As yet another example, a performance counter could be used to facilitate hardware queue analysis. In particular, it is a feature of the invention that it can be implemented in a generic, scalable, "counter block" architecture that is flexible enough to be customized for inclusion in most integrated circuit chip designs without any changes in the core counter block for different implementations.

One basic aspect of the example embodiment of the invention is having dedicated hardware within a component, such as an IC chip or chipset, that enables the gathering of statistics of internal hardware events in real-time. This hardware provides direct event counting and timing for performance monitoring purposes. It provides enough visibility into the internal architecture to perform utilization studies and workload characterization, which in turn enables faster component validation, higher performance future components, and applications tuned to the current component. This benefits both internal and external hardware and software development.

The example embodiment of the invention consists of a reusable module that minimizes hardware and software resource requirements when it is integrated as part of a component. The module is especially well suited for the chipsets of desktop computer, mobile computer, or servers, either with or without graphics integrated in the chipset. The module is flexible enough to scale down to a silicon overhead of approximately 5000–7,000 gates. Routing overhead is determined by which events are made to be observable in a particular implementation.

At the heart of the invention are performance counters, each with associated registers for interfacing with the counters. Each counter has corresponding command, event, status, and data registers which are all packaged together with the counter in a counter block. Thus, the invention has the advantage that it may be easily scaled so that an IC chip or chipset may include as few as two such counter blocks or many more counter blocks. Each implementation selects the number of counter blocks it will implement, and therefore how many counter blocks (or slices) it will have. The primary limitation on the number of counter blocks in a particular implementation in an IC chip or component of a chipset is the amount of silicon area that the designers wish to make available for that purpose and the number of registers which can be supported by memory. When the counter blocks are not part of their own PCI device, there are sometimes limitations on the available register space. registers which can be supported by memory. When the counter blocks are not part of their own PCI device, there are sometimes limitations on the available register space.

FIG. 1 shows a counter block according to an example embodiment of the invention. Although only one counter block is shown in FIG. 1, the multiplexers, registers, and all other logic is repeated for each counter block present as desired in a particular implementation. There is a threshold event 109 generated from a comparison 108 in each counter block that feeds into each multiplexer.

Signals representing events from throughout the chip are routed to event preconditioning 101 in each one of the counter blocks. Software can select events that will be recorded during a measurement session. The number of counters in an implementation defines the number of events that can be recorded simultaneously. According to an example embodiment of the invention, hardware events can control the starting, stopping, and sampling of the counters in an event-based manner using command trigger 102. Each counter 107 can be either incremented by an increment event 103 or decremented by a decrement event 104. The increment events and decrement events are not predetermined and can be different events. In addition to the simple counting of events, the unit can provide data for histograms, queue analysis, and conditional event counting (i.e., how many times did event "A" happen before the first event "B" took place).

When counter 107 is sampled, the current value of the counter is latched into its corresponding data register 106. The command, event, and status registers 105, and data register 106, are accessible via a register access bus. They may be conventional standard PCI memory mapped registers in order to facilitate high-speed sampling. This component may be a Plug-and-Play PCI compliant device with a base address scheme for its memory mapped space. The registers and counters may be composed of conventional elements known in the art. Data samples also may be obtained and provided to the counters in the manner presently known in the art. The counter blocks are preferably adapted to accept data samples of different types during different measuring operations. Separate control (not shown in FIG. 1) may be provided to control clock signals and synchronization timing and clearing and initialization of the registers (either by a reset operation or writing a value of zero to the register). As to timing, the registers and multiplexor may receive a clock signal which is set at the rate of the data samples and is synchronized to the data samples.

Hardware event based control refers to the ability of hardware events to control the starting, stopping, sampling (or any other command controlled function) of the performance counters that are integrated within a component. The events that are counted are the same internal hardware events that can control the unit. The hardware events that control the state of each counter are events that occur naturally within the component that the counters have been designed to monitor, or events that are generated by other logic within the performance counters unit, or from an external source through an input pin. The events that are generated within the counters unit that can control the execution of control commands are:

1. a programmable threshold condition was true;
2. a command was triggered to begin; and
3. a counter overflow or underflow occurred.

In an IC chip or chipset, two or more external pins may allow for external visibility and control of the counters. One or more of the pins may be an output pin which signals that one of the above conditions generated an interrupt from one of the counters. Another one or more of the pins may be an input pin which allows an external source to control when a command is executed by one of the counter blocks.

An example of hardware event based counter control is controlling when a sample (snapshot) is taken of the active counter(s). This is required to facilitate, among other things, hardware queue analysis. No command will be executed until the command trigger multiplexer detects the event in the command trigger field of the command register. This allows start, stop, sample, and other commands to be executed as a result of other events happening.

Command trigger refers to the ability of a command to be issued to the performance counters unit, and not have it executed until the desired event, as programmed when the pending command was issued, is detected. A counter block has no ability to queue commands so programming must not overwrite pending commands unless that is the desired effect.

Figure 2:
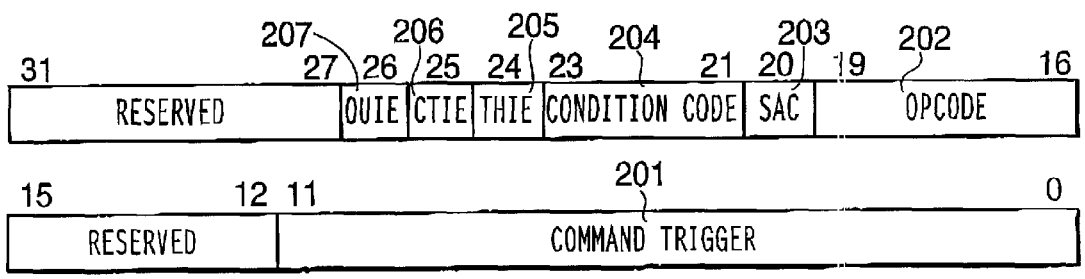
FIG. 2 illustrates an exemplary 32-bit read/write command register in an example embodiment of the invention.

FIG. 2 illustrates an exemplary 32-bit read/write command register which allows control of an associated counter. If the command register contained a command that was still waiting to be triggered, and the opcode field was written, the unexecuted opcode would be flushed without ever being executed. The currently executing command will continue to be executed only until the newly programmed command is triggered to execute. Although specifics are provided herein, this command register is merely an example and other register schemes may be used as the command register.

Command Trigger field 201 is composed of the lower 12 bits [11:0] of the register. Opcode field 202 is composed of 4 bits [19:16]. The Select ALL Counters (SAC) field 203 is a single bit [20]. The Condition Code (CC) field 204 is composed of three bits [23:21]. The Threshold Indicator Enable (THIE) 205 is a single bit [24]. The Command Trigger Indicator Enable (CTIE) 206 is a single bit [25]. The Overflow/Underflow Indicator Enable (OUIE) 207 is a single bit [26]. Of course, the fields may be of different sizes and at different bit locations than those of the exemplary bit register.

Command Trigger field 201 contains the Event Selection Code (ESC) that the counter block must detect before executing the opcode. The previously programmed opcode continues to execute until this command trigger is detected. There may be a special ESC code (such as 000 h) which causes the command to be triggered immediately upon being written to the command register. This special command trigger also causes that command to be executed (triggered) once and only once. All other ESC codes (non-zero codes) cause the command to be re-executed every time the trigger is detected.

There are preferably at least 7 distinct commands which may be stored in Opcode field 202. If the command is a Stop command, then the associated counter does not count. If the command is a Start command, then the associated counter begins counting. The counter increments by one if the corresponding increment event occurs or decrements by one if the corresponding decrement event occurs. All duration type events toggle every counter block clock tick that the event is true. The desired increment and decrement events must be selected before this command executes. If the command is a Sample command, the counter value is latched into the corresponding data register, which can then be read by reading that data register. The counter continues to count without being reset.

If the command is a Reset command, the associated counter and register is reset to 0000 0000 h. The 32 bit wide data registers allow 4 billion clock ticks or occurrences to be counted between sample commands. When the counter rolls over, the overflow status bit will be set in the corresponding status register If the command is a Restart command, the counter resets and then starts counting again. This is essentially a Reset command and a Start command combined into a single command. This functionality facilitates histogramming by allowing an event to trigger to clear the counter and resume counting with no further intervention. If the command is a Sample & Restart command, the Sample command is executed and is followed immediately by the Restart command. If the command is a Preload command, the counter is set to the value that is located in the associated data register. This facilitates rollover and overflow validation. The counter remains in the same state when preloaded. If the counter was counting before the preload was executed, it will continue to count after the preload. It is software's responsibility to ensure that the counter is in the desired state (example: execute stop command) prior to issuing a preload command.

The SAC field 203 bit is only valid in the command register of one of the counter blocks and is reserved in the command register of all other counter blocks. If the SAC field bit is set, the instruction in the command register is applied to the counters of ALL counter blocks. (If it is not set, the instruction in the command register is applied only to the counter associated with the command register.) This means that every command register is written to with the same value that was written to this particular command register. This is particularly handy for resetting all counters with a single command or starting or stopping all counters simultaneously.

The CC field 204 contains the code that indicates what type of threshold compare is done between the counter and the data register. For all non-zero values of this field, the counter's data register will contain the threshold value. The outcome of this compare will generate a threshold event and potentially an interrupt if that capability is enabled. The highest bit is for less than (<). The middle bit is for equal (=). The lowest bit is for greater than (>). The proper bit mask can be selected for the desired threshold condition as follows:

000=False (no threshold compare)
001=Greater Than
010=Equal
011=Greater Than or Equal
100=Less Than
101=Not Equal
110=Less Than or Equal
111=True (always generate threshold event)

The THIE field 205 bit can provide an indication when the threshold condition is true. If the THIE field bit is set, the output signal/pin will be asserted when the threshold condition is true. (If the THIE field bit is not set, no indication is provided when the threshold condition is true except for setting the Threshold Indicator (TI) status bit.) This is an output signal/pin that is shared by all indicators. A global interrupt mask controls whether an interrupt is also generated. An interrupt service routine can check the status bits associated with enabled interrupts to determine how the interrupt was generated.

The CTIE field 206 bit can provide an indication when a command is triggered. If the CTIE field bit is set, the output signal/pin will be asserted when a command is triggered. (If the CTIE field bit is not set, no indication will be provided when a command is triggered except for setting the Command Trigger Indicator (CTI) status bit.) This is an output signal/pin that is shared by all indicators. A global interrupt mask controls whether an interrupt is also generated. An interrupt service routine can check the status bits associated with enabled interrupts to determine how the interrupt was generated.

The OUIE field 207 bit can provide an indication when a counter overflow or underflow occurs. If the OUIE field bit is set, the output signal/pin will be asserted to indicate that a counter overflow or underflow occurs. (If the OUIE field bit is not set, no indication is provided when a counter overflow or underflow occurs except for setting the Overflow/Underflow Indicator (OUI) status bit.) This is an output signal/pin that is shared by all indicators. A global interrupt mask controls whether an interrupt is also generated. An interrupt service routine can check the status bits associated with enabled interrupts to determine how the interrupt was generated.

Figure 3:
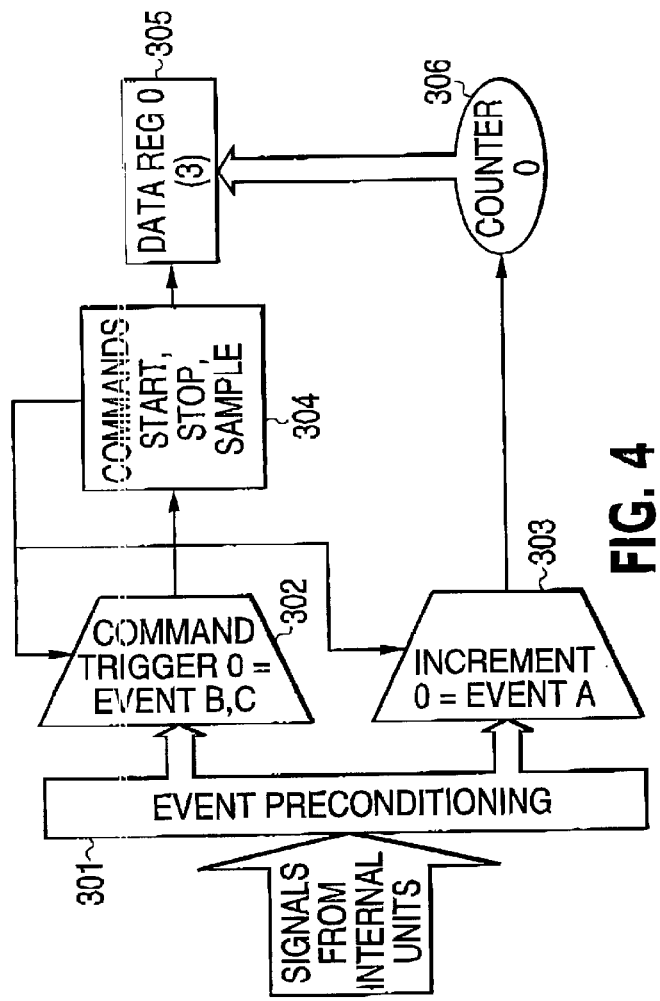
FIG. 3 is a block diagram of an event based control according to an example embodiment of the invention.
Figure 4:
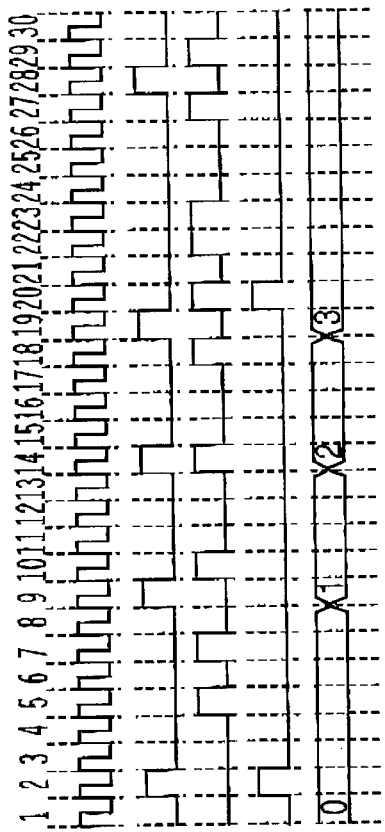
FIGS. 4(a)–4(e) are various waveforms corresponding to the event based control example illustrated in FIG. 3.

As one example application of the invention, the number of cache hits (event A) that occur between the time a cache flush (event B) occurs and the first cache miss (event C) occurs can be counted. The block diagram of this example is illustrated in FIG. 3 and the various waveforms are illustrated in FIGS. 4(a)–4(e). The desired counter blocks are programmed to start counting the cache hit events (event A shown in FIG. 4(b)) by incrementing by one for each cache hit event (303). For the counter 306 to actually begin counting and increment, the start command must first be triggered to begin by detecting an occurrence of a cache flush (event B shown in FIG. 4(c)). Immediately following that command the counter block controller is programmed to stop counting the events and latch the counted value (shown in FIG. 4(e)) into data register 305. However, execution of this command is conditional upon a cache miss occurring (event C in FIG. 4(d)). Thus, the cache miss command becomes the Command Trigger 302 that must occur before the number of cache hits would no longer be counted.

The danger in this is that event C may be detected before event B, in which case the start command is overwritten before it begins to execute and no data is overwritten. The key to maintaining proper command flow in this case is to be watching the Command Trigger Indicator and to not execute event C until it has been confirmed that event B has already triggered the start command to begin executing. The same thing could happen with the Sample command. The Command Trigger Indicator must first indicate that the Stop command has been executed.

Hardware Event Based Event Counting Example

| Opcode | Increment Event | Decrement Event | Trigger Event |
|---|---|---|---|
| Write Event Register | Event A | None (000h) | |
| Start | | | Event B |
| Stop | | | Event C |
| Sample | | | None |
| Read Data Register | | | |

Figure 5:
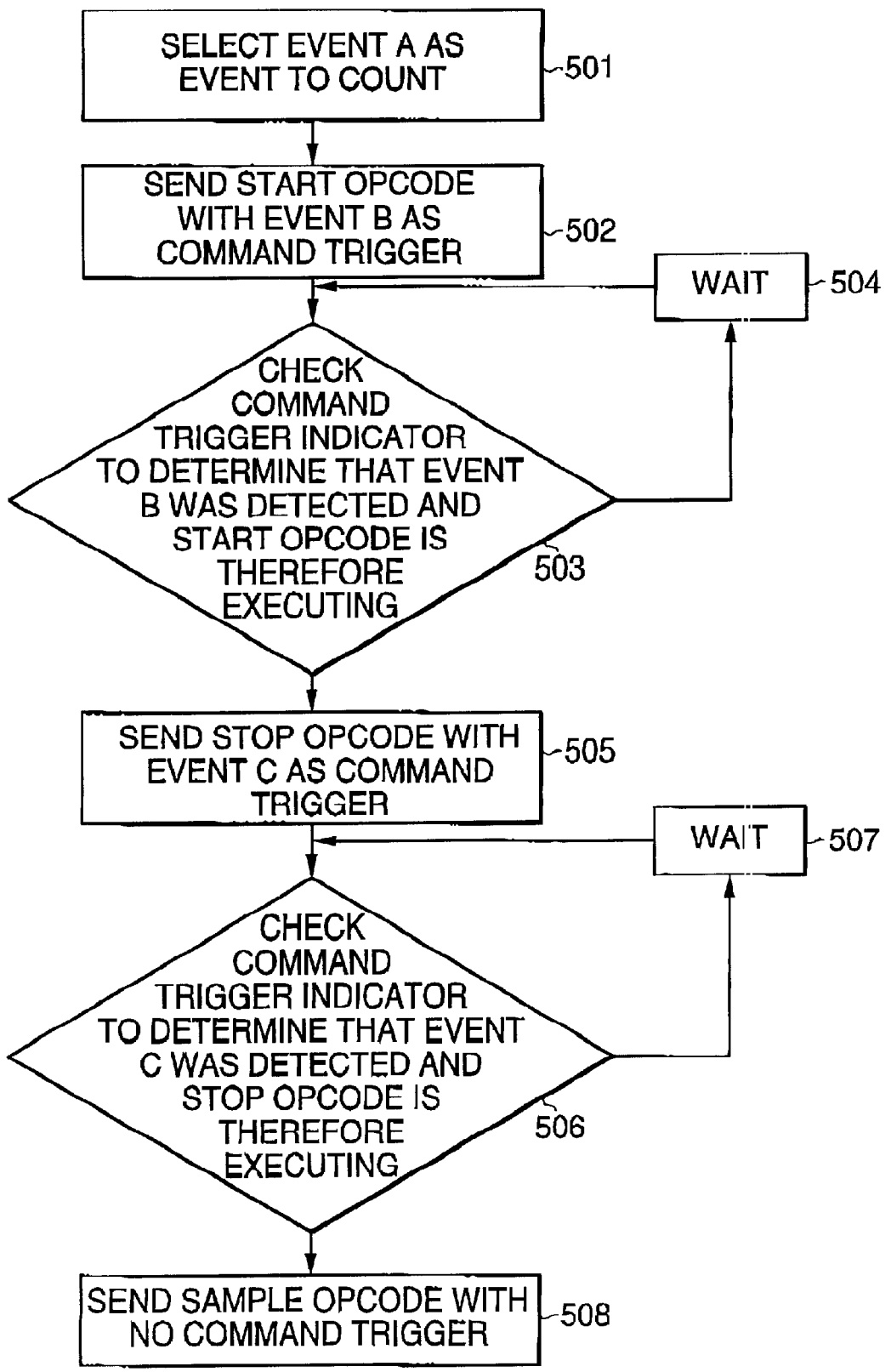
FIG. 5 is a software flowchart of the hardware based event based control example illustrated in FIGS. 3 and 4.

FIG. 5 is a flowchart illustrating an example method of programming the hardware based event control example embodiment of the invention shown in FIGS. 3 and 4(a)–4(e). First, the event to be counted is selected (501). A Start opcode is sent to the command register with event B as the command trigger (502). The Command Trigger Indicator (CTI) is continually checked until event B is detected and the Start opcode is therefore executing (503 and 504). The Stop opcode is then sent with event C as the command trigger (505). The Command Trigger Indicator is continually checked until event C is detected and the Stop opcode is therefore executing (506 and 507). Then, the Sample opcode is sent with no command trigger (508).

With hardware support for complete event based control as described in the example embodiments above, any event (graphics or otherwise) can control the counters without any interaction with a software driver even though in some cases it may be desirable to have the software checking the indicator bits as outlined in the previous example. This new functionality goes beyond the limitations in conventional systems to enable truly dynamic control of performance counters. Although an example embodiment is described above, the invention is not limited in its application to any particular processor or chipset. Indeed, an important aspect of the invention is that it is particularly useful for any silicon device employing large registers and counters for counting and measuring successive data values.

Other features of the invention may be apparent to those skilled in the art from the detailed description of the example embodiments and claims when read in connection with the accompanying drawings. While the foregoing and following written and illustrated disclosure focuses on disclosing example embodiments of the invention, it should be understood that the same is by way of illustration and example only, is not to be taken by way of limitation and may be modified in learned practice of the invention. While the foregoing has described what are considered to be example embodiments of the invention, it is understood that various modifications may be made therein and that the invention may be implemented in various forms and embodiments, and that it may be applied in numerous applications, only some of which have been described herein. It is intended by the following claims to claim all such modifications and variations.

What is claimed is:

1. An integrated circuit chip comprising:
   a plurality of counters, each one of said plurality of counters counting data events in said integrated circuit chip;
   a plurality of registers associated with each one of said plurality of counters, at least one of said plurality of registers storing a command controlling an associated counter upon the detection of a hardware event specified in the command; and
   a command trigger issuing an indication upon the detection of the hardware event specified in the command, said associated counter being controlled according to the stored command in response to tie command trigger.

2. The integrated circuit chip recited in claim 1, wherein the command stored in said at least one register includes an event selection code identifying said hardware event.

3. The integrated circuit chip recited in claim 2, wherein the command stored in said at least on register includes an operation code identifying the control operation to be performed on the associated counter in response to the command trigger.

4. The integrated circuit chip recited in claim 1, wherein said associated counter is controlled to sample said data events according to a time period determined by said hardware event.

5. The integrated circuit chip recited in claim 4, wherein said plurality of registers for each one of said plurality of counters includes a data register, said data register being controlled to store the count of the associated counter.

6. The integrated circuit chip recited in claim 1, wherein the integrated circuit chip comprises a processor.

7. The integrated circuit chip recited in claim 6, wherein the associated counter counts data events related to the performance of said processor.

8. The integrated circuit chip recited in claim 7, wherein the associated counter counts the number of cache misses between a cache flush and a cache hit.

9. The integrated circuit chip recited in claim 6, wherein the associated counter counts data related to queue analysis of the processor.

10. The integrated circuit chip recited in claim 1, wherein the integrated circuit chip comprises a memory controller hub.

11. A method of successively monitoring data samples relating to the performance of an integrated circuit chip, comprising:
    storing a command in a command register in said integrated circuit chip, said command including a command trigger indicating a hardware event and an operation code indicating a control operation to be performed upon detection of the hardware event indicated by said command trigger;
    controlling a counter in said integrated circuit chip in accordance with said operation code included in said command to count events relating to the performance of the integrated circuit chip; and
    obtaining data samples from the counter relating to the performance of the integrated circuit chip.

12. The method recited in claim 11, further comprising storing data samples from said counter in an associated data register.

13. The method recited in claim 12, wherein the command is stored in the register chronologically at the beginning of the method.

14. The method recited in claim 12, wherein starting and stopping of counting by the associated counter is determined by a plurality of respective commands.

15. The method recited in claim 14, wherein a command trigger signal is generated entirely within the integrated circuit chip.

16. The method recited in claim 11, wherein the method is implemented entirely within the integrated circuit chip.

17. The integrated circuit chip recited in claim 1, wherein the plurality of counters comprise a plurality of performance counters and said associated counter comprises an associated performance counter.

18. The integrated circuit chip recited in claim 10, wherein the plurality of counters comprise a plurality of performance counters relating to the performance of said memory controller hub and said associated counter comprises an associated performance counter.

* * * * *